(12) United States Patent
Wang et al.

(10) Patent No.: US 11,616,193 B2
(45) Date of Patent: Mar. 28, 2023

(54) SEMICONDUCTOR DEVICE AND METHOD FOR FABRICATING THE SAME

(71) Applicant: UNITED MICROELECTRONICS CORP., Hsin-Chu (TW)

(72) Inventors: Hui-Lin Wang, Taipei (TW); Po-Kai Hsu, Tainan (TW); Chen-Yi Weng, New Taipei (TW); Jing-Yin Jhang, Tainan (TW); Yu-Ping Wang, Hsinchu (TW); Hung-Yueh Chen, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 2 days.

(21) Appl. No.: 17/338,632

(22) Filed: Jun. 3, 2021

(65) Prior Publication Data

US 2021/0296570 A1 Sep. 23, 2021

Related U.S. Application Data

(63) Continuation of application No. 16/589,157, filed on Oct. 1, 2019, now Pat. No. 11,063,207.

(30) Foreign Application Priority Data

Sep. 6, 2019 (CN) .......................... 201910841032.7

(51) Int. Cl.
| | |
|---|---|
| *H01L 43/02* | (2006.01) |
| *H01L 27/22* | (2006.01) |
| *H01L 43/08* | (2006.01) |
| *H01L 43/12* | (2006.01) |

(52) U.S. Cl.
CPC ............ *H01L 43/02* (2013.01); *H01L 27/222* (2013.01); *H01L 43/08* (2013.01); *H01L 43/12* (2013.01)

(58) Field of Classification Search
CPC ....... H01L 43/02; H01L 27/222; H01L 43/08; H01L 43/12; H01L 27/228; G11C 11/161
See application file for complete search history.

(56) References Cited

U.S. PATENT DOCUMENTS

| | | |
|---|---|---|
| 8,183,061 B2 | 5/2012 | Zhong |
| 9,159,910 B2 | 10/2015 | Kang |
| 9,818,935 B2 | 11/2017 | Chuang |
| 10,529,913 B1 * | 1/2020 | Chen ..................... H01L 27/228 |
| 2013/0171742 A1 | 7/2013 | Wang |
| 2015/0171314 A1 | 6/2015 | Li |
| 2016/0365505 A1 | 12/2016 | Lu |
| 2017/0069835 A1 | 3/2017 | Sonoda |
| 2017/0148849 A1 | 5/2017 | Chuang |
| 2017/0222128 A1 | 8/2017 | Sung |
| 2018/0350874 A1 | 12/2018 | Chuang |

(Continued)

*Primary Examiner* — Karen Kusumakar
*Assistant Examiner* — Adam S Bowen
(74) *Attorney, Agent, or Firm* — Winston Hsu

(57) ABSTRACT

A semiconductor device includes: a substrate comprising a magnetic tunneling junction (MTJ) region and a logic region, a MTJ on the MTJ region, a top electrode on the MTJ, a connecting structure on the top electrode, and a first metal interconnection on the logic region. Preferably, the first metal interconnection includes a via conductor on the substrate and a trench conductor, in which a bottom surface of the trench conductor is lower than a bottom surface of the connecting structure.

13 Claims, 10 Drawing Sheets

(56) References Cited

U.S. PATENT DOCUMENTS

2019/0164584 A1 5/2019 Chuang
2020/0035908 A1* 1/2020 Ku ................... H01L 21/76802
2020/0328251 A1 10/2020 Dutta

* cited by examiner

SEMICONDUCTOR DEVICE AND METHOD FOR FABRICATING THE SAME

CROSS REFERENCE TO RELATED APPLICATIONS

This is a continuation application of U.S. patent application Ser. No. 16/589,157, filed on Oct. 1, 2019, and all benefits of such earlier application are hereby claimed for this new continuation application.

BACKGROUND OF THE INVENTION

1. Field of the Invention

The invention relates to a semiconductor device and method for fabricating the same, and more particularly to a magnetoresistive random access memory (MRAM) and method for fabricating the same.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating semiconductor device includes: forming a substrate having a magnetic tunneling junction (MTJ) region and a logic region; forming a MTJ on the MTJ region; forming a top electrode on the MTJ; forming an inter-metal dielectric (IMD) layer around the MTJ; removing the IMD layer directly on the top electrode to form a recess; forming a first hard mask on the IMD layer and into the recess; removing the first hard mask and the IMD layer on the logic region to form a contact hole; and forming a metal layer in the recess and the contact hole to form a connecting structure on the top electrode and a metal interconnection on the logic region.

According to another aspect of the present invention, a semiconductor device includes: a substrate comprising a magnetic tunneling junction (MTJ) region and a logic region; a MTJ on the MTJ region; a top electrode on the MTJ; a connecting structure on the top electrode; and a first metal interconnection on the logic region. Preferably, the first metal interconnection includes a via conductor on the substrate and a trench conductor, in which a bottom surface of the trench conductor is lower than a bottom surface of the connecting structure.

According to yet another aspect of the present invention, a semiconductor device includes: a substrate comprising a magnetic tunneling junction (MTJ) region and a logic region; a MTJ on the MTJ region; a top electrode on the MTJ; and a connecting structure on the top electrode. Preferably, the connection structure includes a hard mask on the top electrode, a barrier layer on the hard mask, and a metal layer on the barrier layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
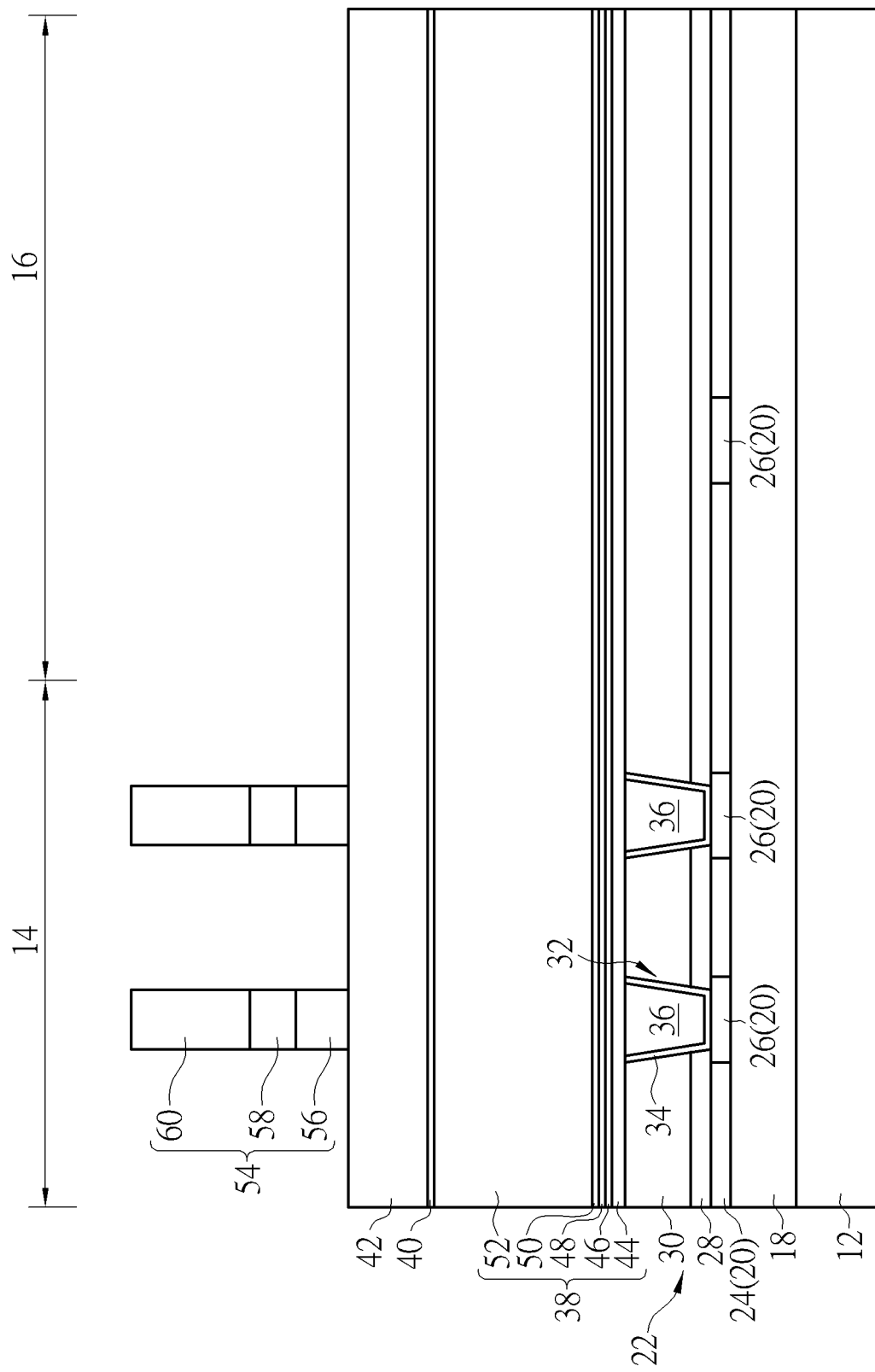
FIGS. 1-9 illustrate a method for fabricating a semiconductor device according to an embodiment of the present invention.

Referring to FIGS. 1-9, FIGS. 1-9 illustrate a method for fabricating a semiconductor device, or more specifically a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MTJ region 14 and a logic region 16 are defined on the substrate 12.

Active devices such as metal-oxide semiconductor (MOS) transistors, passive devices, conductive layers, and interlayer dielectric (ILD) layer 18 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 18 could be formed on the substrate 12 to cover the MOS transistors, and a plurality of contact plugs could be formed in the ILD layer 18 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 20, 22 are sequentially formed on the ILD layer 18 on the MTJ region 14 and the edge region 16 to electrically connect the aforementioned contact plugs, in which the metal interconnect structure 20 includes an inter-metal dielectric (IMD) layer 24 and metal interconnections 26 embedded in the IMD layer 24, and the metal interconnect structure 22 includes a stop layer 28, an IMD layer 30, and metal interconnections 32 embedded in the stop layer 28 and the IMD layer 30.

In this embodiment, each of the metal interconnections 26 from the metal interconnect structure 20 preferably includes a trench conductor and each of the metal interconnections 32 from the metal interconnect structure 22 on the MTJ region 14 includes a via conductor. Preferably, each of the metal interconnections 26, 32 from the metal interconnect structures 20, 22 could be embedded within the IMD layers 24, 30 and/or stop layer 28 according to a single damascene process or dual damascene process. For instance, each of the metal interconnections 26, 32 could further includes a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 are preferably made of copper, the IMD layers 24, 30 are preferably made of silicon oxide, and the stop layers 28 is preferably made of nitrogen doped carbide (NDC), silicon nitride, silicon carbon nitride (SiCN), or combination thereof.

Next, a MTJ stack 38 or stack structure is formed on the metal interconnect structure 22, a cap layer 40 is formed on the MTJ stack 38, and another cap layer 42 formed on the cap layer 40. In this embodiment, the formation of the MTJ stack 38 could be accomplished by sequentially depositing a first electrode layer 44, a fixed layer 46, a barrier layer 48, a free layer 50, and a second electrode layer 52 on the IMD layer 30. In this embodiment, the first electrode layer 44 and the second electrode layer 52 are preferably made of conductive material including but not limited to for example Ta, Pt, Cu, Au, Al, or combination thereof. The fixed layer 46 could be made of antiferromagnetic (AFM) material including but not limited to for example ferromanganese (FeMn), platinum manganese (PtMn), iridium manganese (IrMn), nickel oxide (NiO), or combination thereof, in which the fixed layer 46 is formed to fix or limit the direction of magnetic moment of adjacent layers. The barrier layer 48 could be made of insulating material including but not limited to for example oxides such as aluminum oxide ($AlO_x$) or magnesium oxide (MgO). The free layer 50 could be made of ferromagnetic material including but not limited to for example iron, cobalt, nickel, or alloys thereof such as cobalt-iron-boron (CoFeB), in which the magnetized direction of the free layer 50 could be altered freely depending on the influence of outside magnetic field. Preferably, the cap layer 40 and cap layer 42 are made of different materials. For instance, the cap layer 40 is preferably made of silicon nitride and the cap layer 42 is made of silicon oxide, but not limited thereto.

Next, a patterned mask 54 is formed on the cap layer 42. In this embodiment, the patterned mask 54 could include an organic dielectric layer (ODL) 56, a silicon-containing hard mask bottom anti-reflective coating (SHB) 58, and a patterned resist 60.

Figure 2:
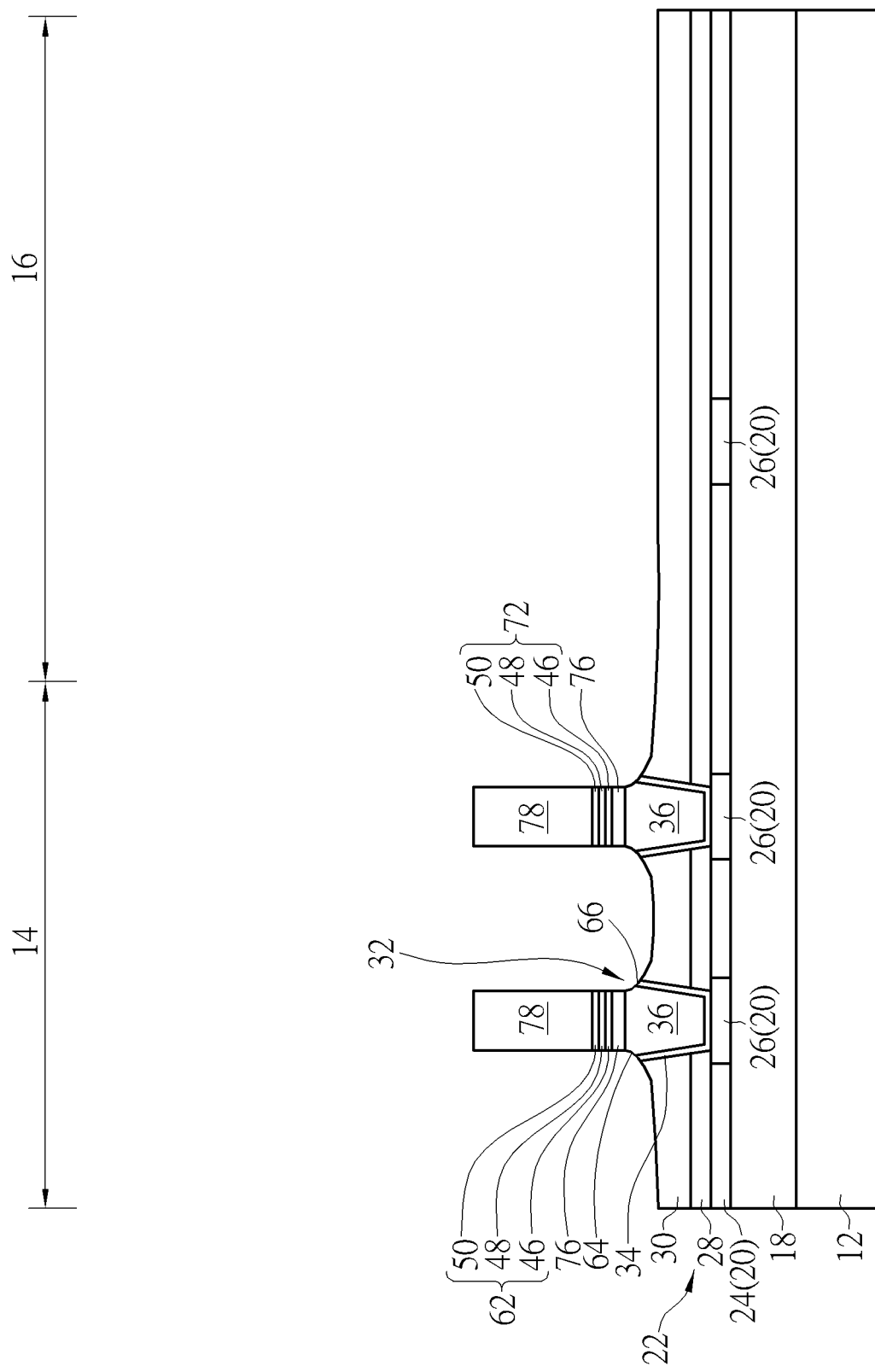

Next, as shown in FIG. 2, one or more etching process is conducted by using the patterned mask 54 as mask to remove part of the cap layers 40, 42, part of the MTJ stack 38, and part of the IMD layer 30 to form MTJ 62 and MTJ 72 on the MTJ region 14, in which the first electrode layer 44 at this stage preferably becomes a bottom electrode 76 for the MTJs 62, 72 while the second electrode layer 52 becomes a top electrode 78 for the MTJs 62, 72 and the cap layers 40, 42 could be removed during the etching process. It should be noted that this embodiment preferably conducts a reactive ion etching (RIE) process by using the patterned mask 54 as mask to remove part of the cap layers 40, 42 and part of the MTJ stack 38, strips the patterned mask 54, and then conducts an ion beam etching (IBE) process by using the patterned cap layer 42 as mask to remove part of the MTJ stack 38 and part of the IMD layer 30 to form MTJs 62, 72. Due to the characteristics of the IBE process, the top surface of the remaining IMD layer 30 is slightly lower than the top surface of the metal interconnections 32 after the IBE process and the top surface of the IMD layer 30 also reveals a curve or an arc.

It should also be noted that when the IBE process is conducted to remove part of the IMD layer 30, part of the metal interconnections 32 are removed at the same time so that a first slanted sidewall 64 and a second slanted sidewall 66 are formed on the metal interconnections 32 adjacent to the MTJ 62, in which each of the first slanted sidewall 64 and the second slanted sidewall 66 could further include a curve (or curved surface) or a planar surface.

Figure 3:
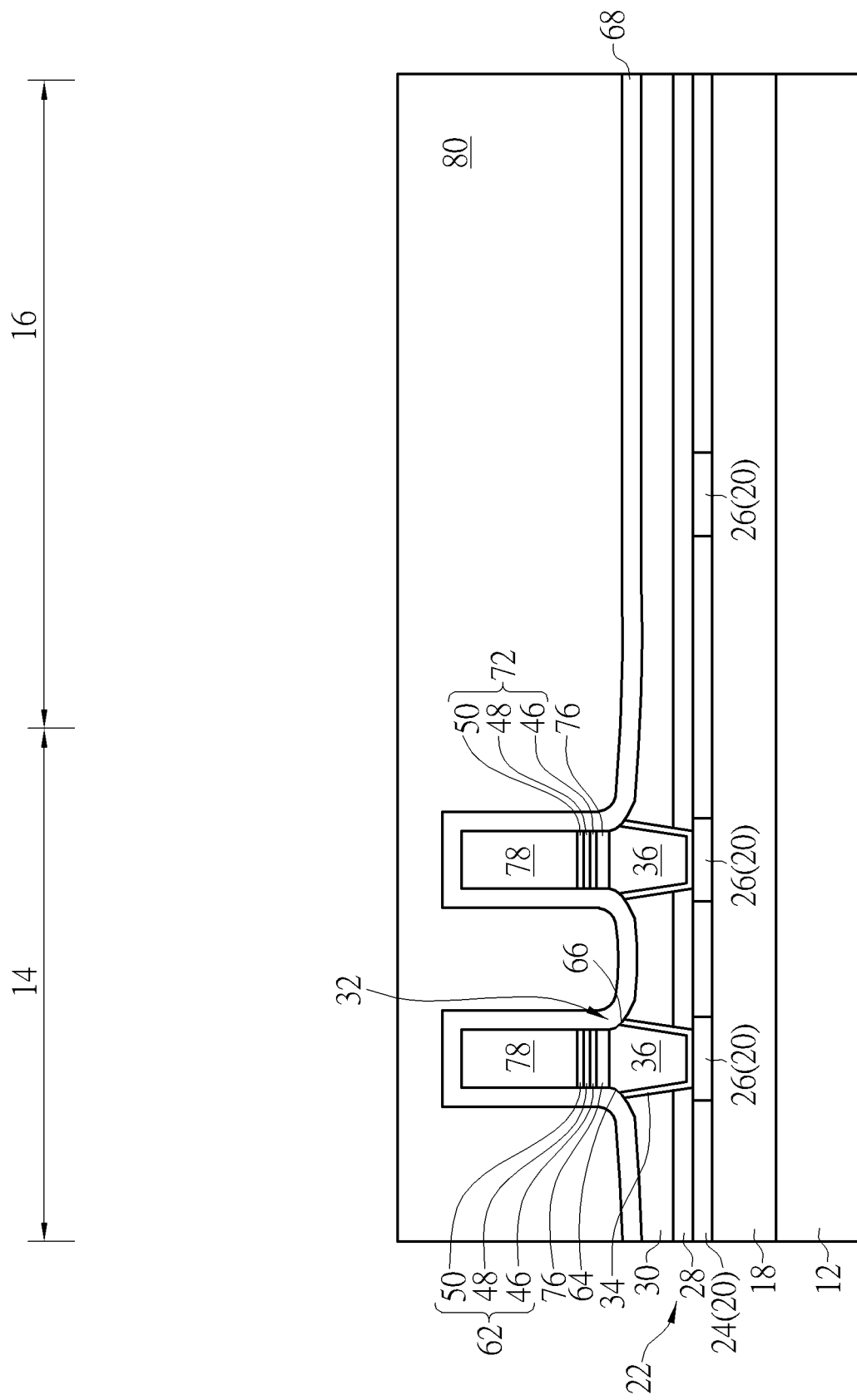

Next, as shown in FIG. 3, a cap layer 68 and an IMD layer 80 are formed on the MTJ 62, 72 to cover the surface of the IMD layer 30, and a planarizing process such as chemical mechanical polishing (CMP) process is conducted to remove part of the IMD layer 80 so that the top surface of the remaining IMD layer 80 is still higher than the top surface of the cap layer 68 directly on top of the top electrodes 78. In this embodiment, the cap layer 68 is preferably made of silicon nitride, but could also be made of other dielectric material including but not limited to for example silicon oxide, silicon oxynitride, or silicon carbon nitride. The IMD layer 80 on the other hand preferably includes an ultra low-k (ULK) dielectric layer, which could include porous dielectric material including but not limited to for example silicon oxycarbide (SiOC).

Figure 4:
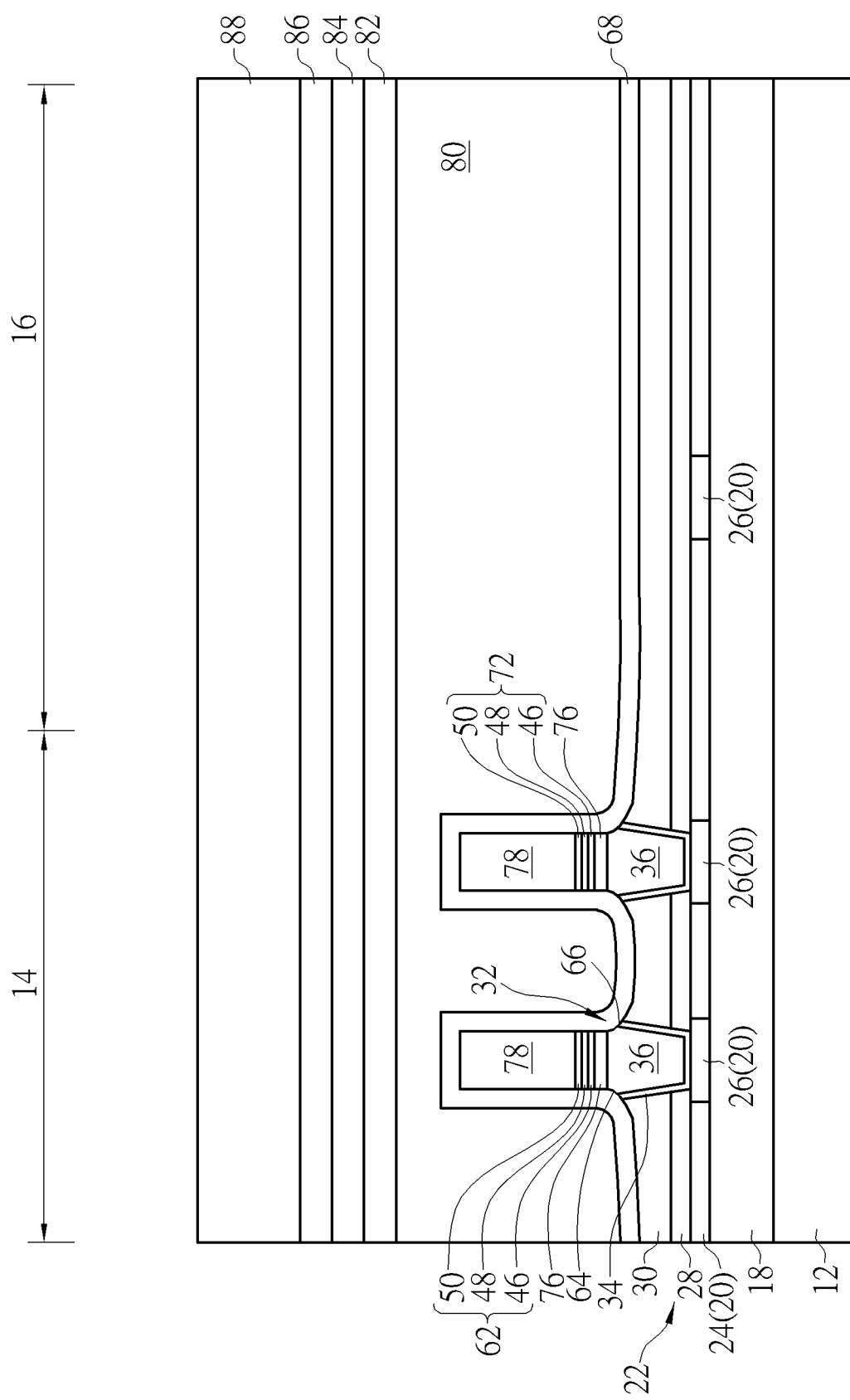

Next, as shown in FIG. 4, a hard mask 82 and a mask layer or mask stack are formed on the surface of the IMD layer 80. In this embodiment, the hard mask 82 preferably includes silicon oxynitride (SiON) while the mask layer could include an ODL 84, a SHB 86, and a resist layer 88.

Figure 5:
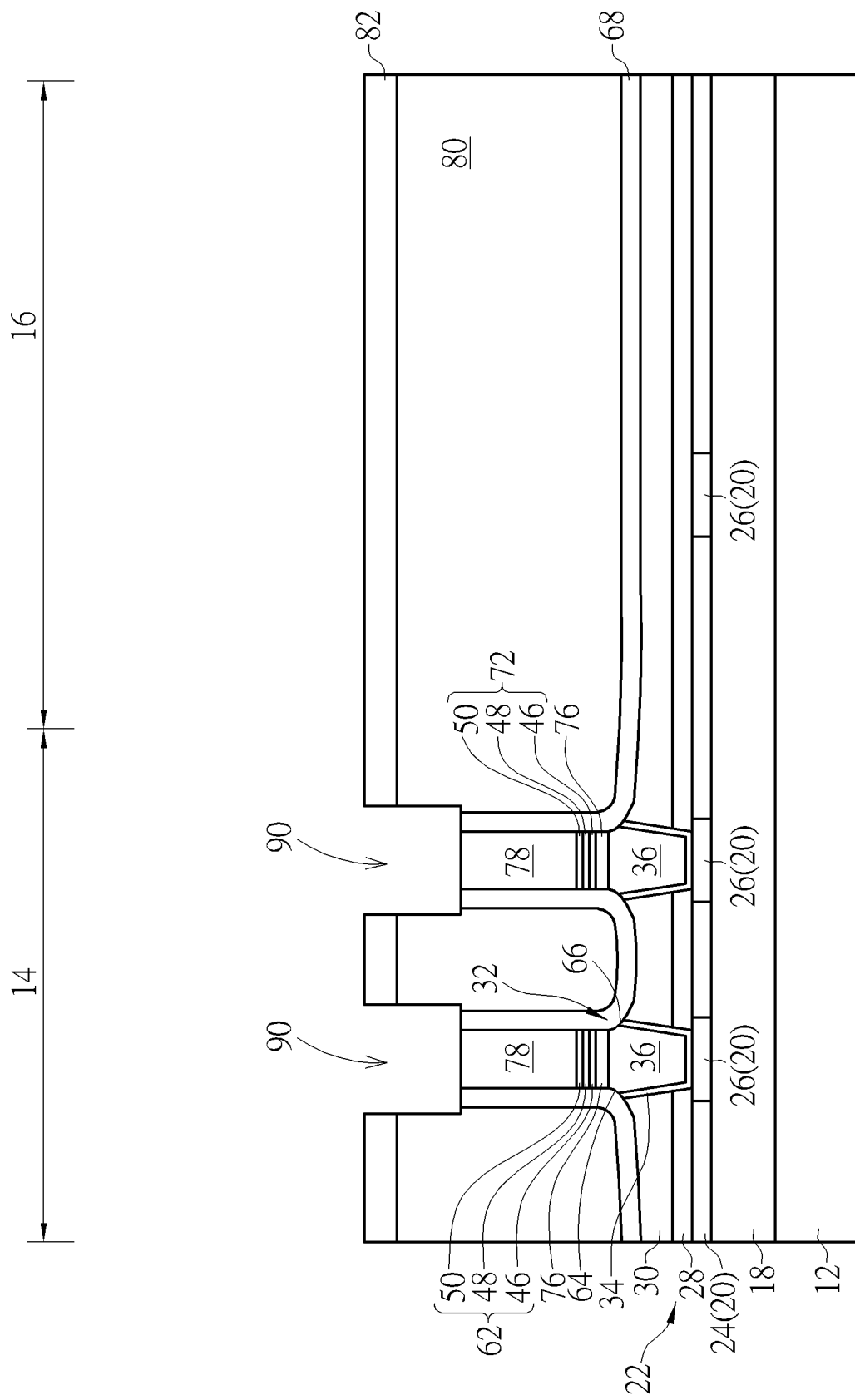

Next, as shown in FIG. 5, a photo-etching process is conducted to first pattern the resist layer 88 and then conducts single or multiple etching processes to remove part of the SHB 86, part of the ODL 84, part of the hard mask 82, part of the IMD layer 80, and part of the cap layer 68 to form recesses 90 exposing the surface of the top electrodes 78. The patterned resist 88, the SHB 86, and the ODL 84 are removed thereafter to expose the surface of the hard mask 82 afterwards.

Figure 6:
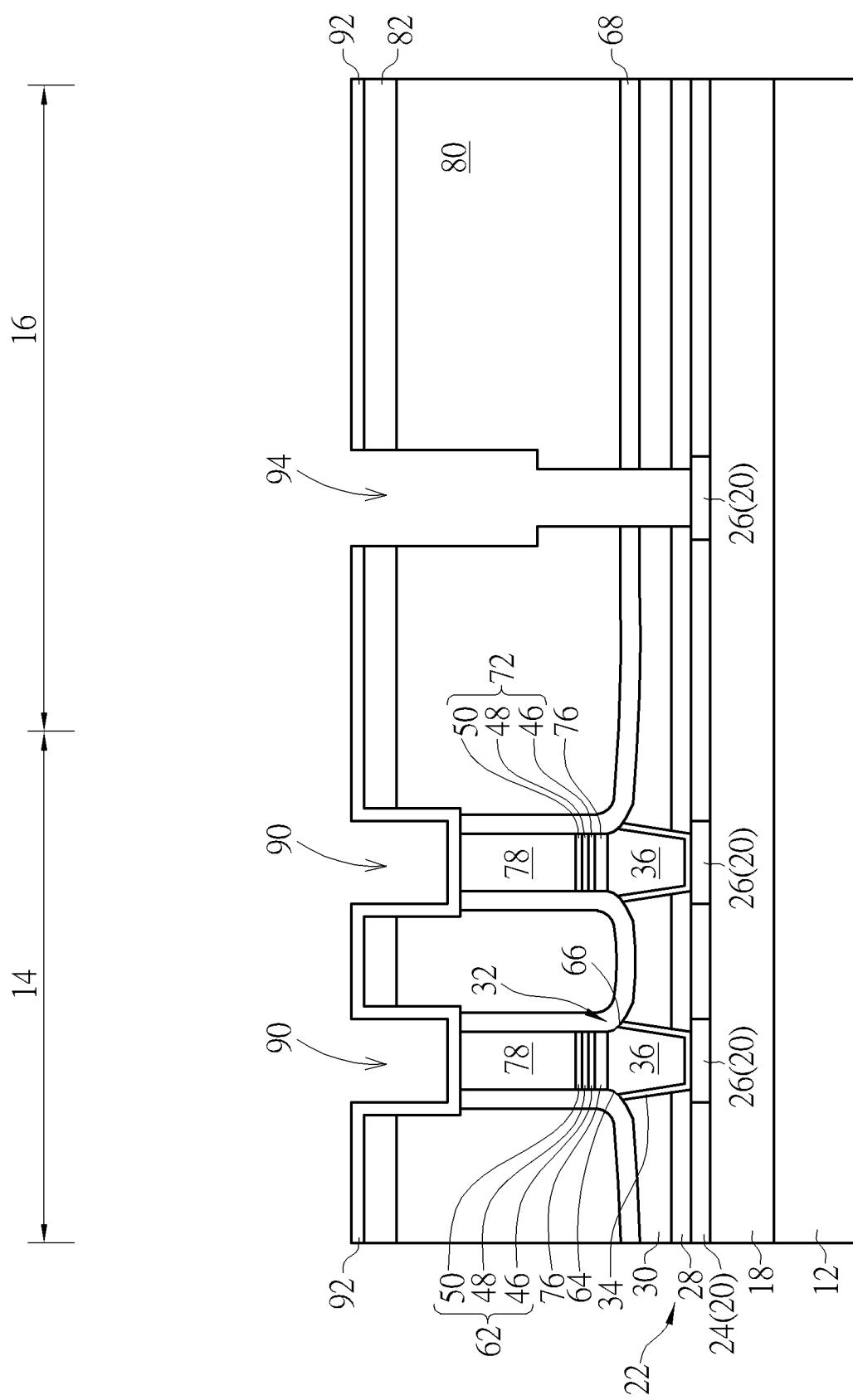

Next, as shown in FIG. 6, another hard mask 92 is formed on the surface of the hard mask 82 and filled into the recesses 90 without filling the recesses 90 completely. In this embodiment, the hard mask 82 and the hard mask 92 are preferably made of different materials, in which the hard mask 92 preferably includes metal nitride or more specifically titanium nitride (TiN). Next, a pattern transfer process is conducted by using a patterned mask (not shown) as mask to remove part of the hard mask 92, part of the hard mask 82, part of the IMD layer 80, part of the cap layer 68, part of the IMD layer 30, and part of the stop layer 28 on the logic region 16 to form a contact hole 94 exposing the metal interconnection 26.

Figure 7:
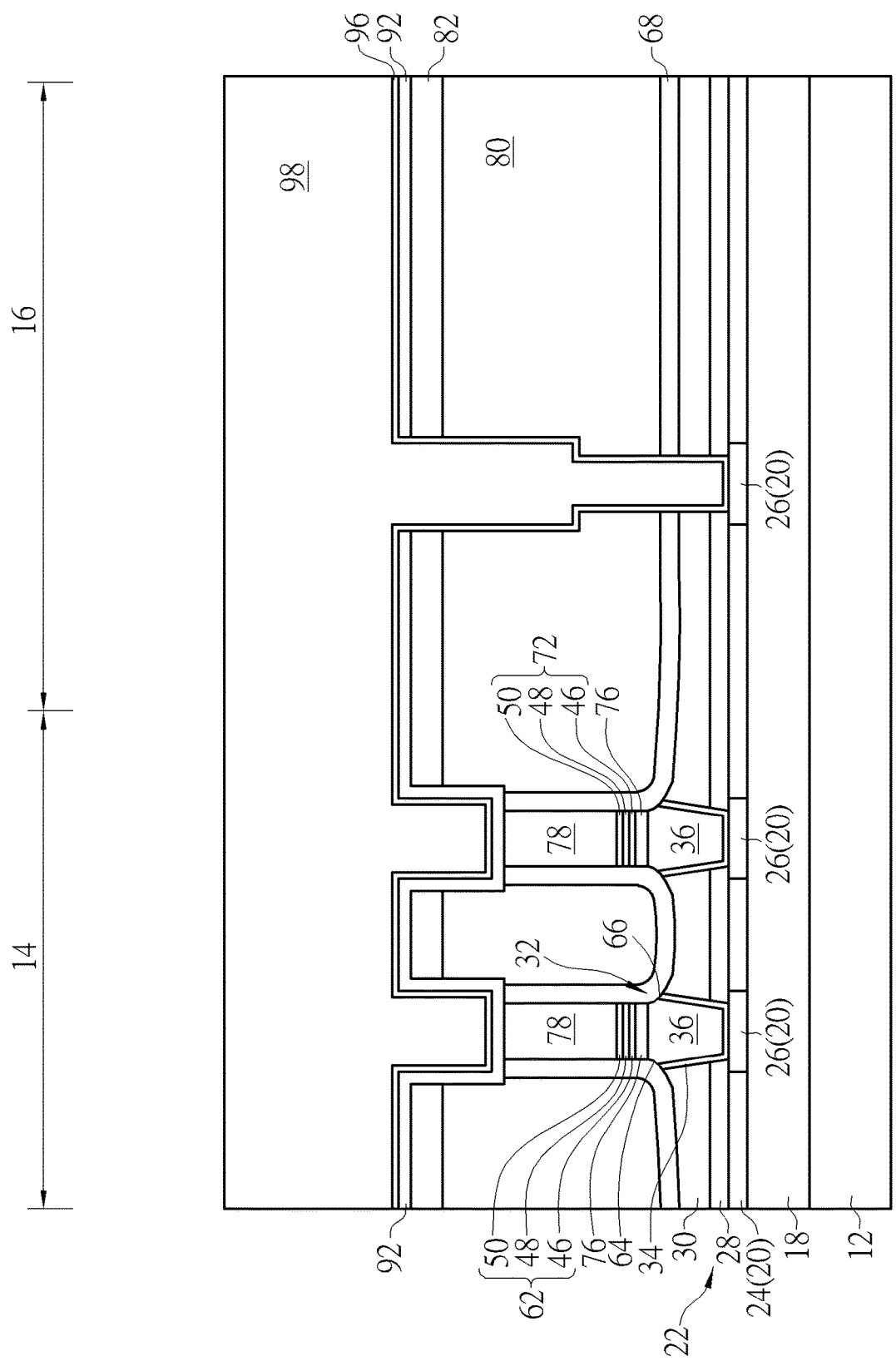

Next, as shown in FIG. 7, a barrier layer 96 and a metal layer 98 are formed into the recesses 90 on MTJ region 14 and the contact hole 94 on logic region 16 to fill the recesses 90 and the contact hole 94 completely, in which the barrier layer 96 could include titanium (Ti), titanium nitride (TiN), tantalum (Ta), tantalum nitride (TaN), or combination thereof and metal layer 98 could include tungsten (W), copper (Cu), aluminum (Al), titanium aluminide (TiAl), cobalt tungsten phosphide (CoWP), or combination thereof.

Figure 8:
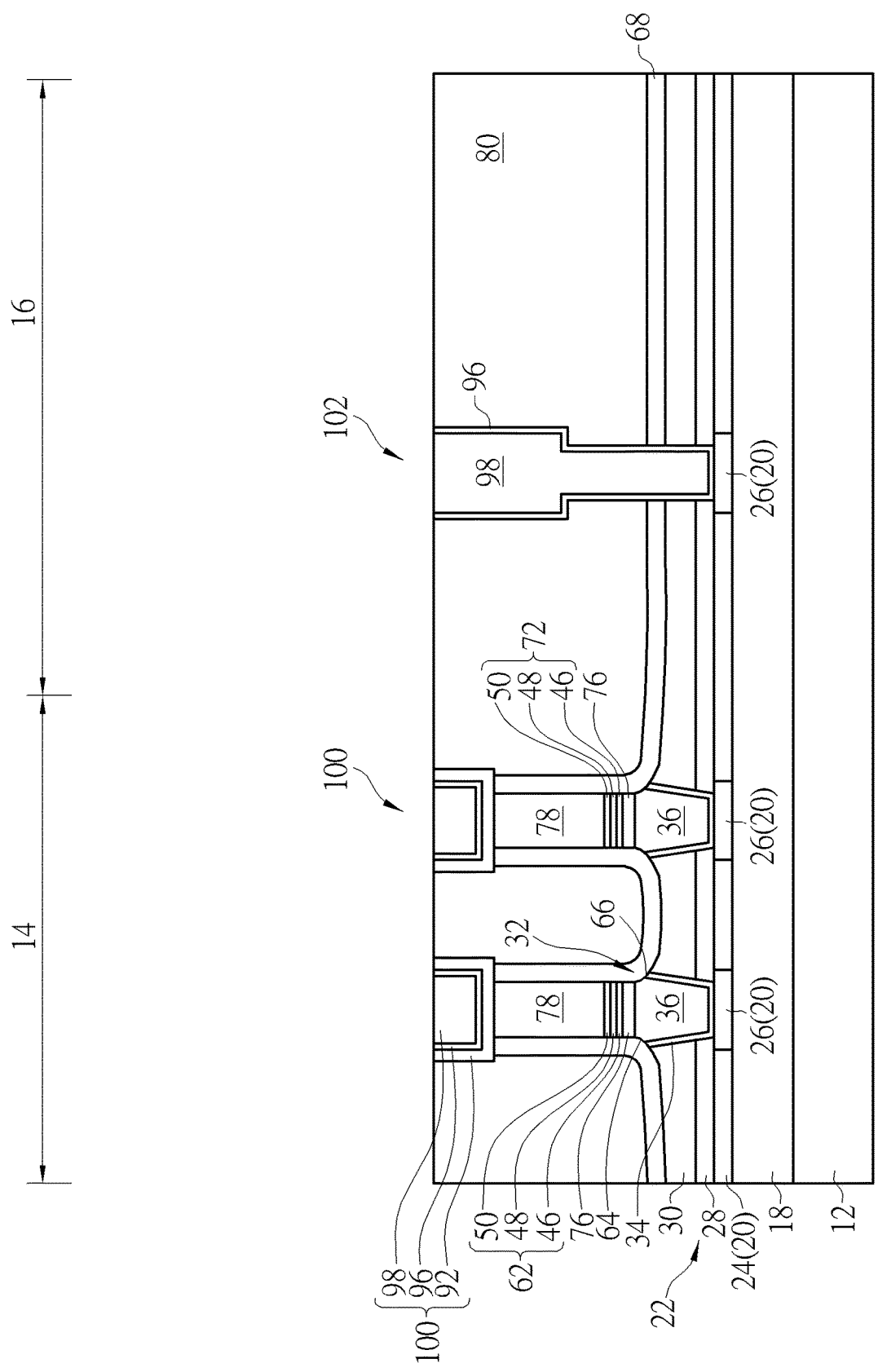

Next, as shown in FIG. 8, a planarizing process such as CMP process is conducted to remove part of the metal layer 98, part of the barrier layer 96, part of the hard mask 92, and the hard mask 82 to form a connecting structure 100 directly on each of the top electrodes 78 and a metal interconnection 102 or contact plug on the logic region 16.

Figure 9:
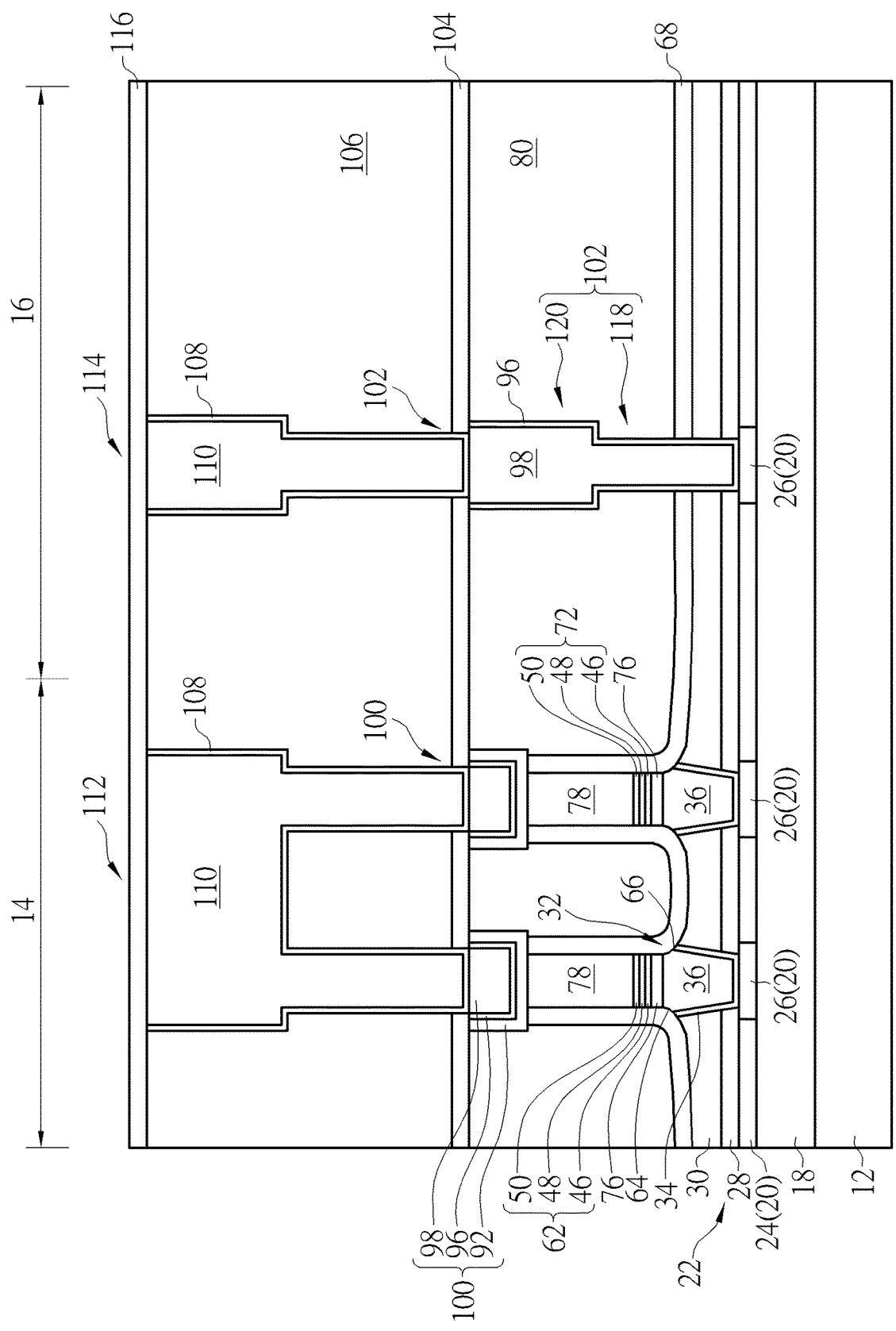

Next, as shown in FIG. 9, a stop layer 104 and another IMD layer 106 are formed on the MTJs 62, 72 to cover the surface of the IMD layer 80, and one or more photo-etching process is conducted to remove part of the IMD layer 106 and part of the stop layer 104 on both MTJ region 14 and logic region 16 to form contact holes (not shown). Next, a barrier layer 108 and a metal layer 110 are formed to fill the contact holes completely, in which the barrier layer 108 could include titanium (Ti), titanium nitride (TiN), tantalum (Ta), tantalum nitride (TaN), or combination thereof and the metal layer 110 could include tungsten (W), copper (Cu), aluminum (Al), titanium aluminide (TiAl), cobalt tungsten phosphide (CoWP), or combination thereof. Next, a planarizing process such as CMP is conducted to remove part of the metal layer 110 and part of the barrier layer 108 to form metal interconnections 112, 114 electrically connecting the connecting structure 100 and metal interconnection 102 underneath respectively, in which the metal interconnection 112 on the MTJ region 14 preferably contacts the connecting structure 100 directly while the metal interconnection 114 on the logic region 16 contacts the metal interconnection 102 directly. Next, another stop layer 116 is formed on the IMD layer 106 to cover the metal interconnections 112, 114. This completes the fabrication of a semiconductor device according to an embodiment of the present invention.

Referring to FIG. 9, FIG. 9 further illustrates a structural view of a semiconductor device according to an embodiment of the present invention. As shown in FIG. 9, the semiconductor device includes metal interconnections 32 disposed on the MTJ region 14, an IMD layer 30 surrounding the metal interconnections 32, MTJs 62, 72 disposed on the metal interconnections 32, top electrodes 78 disposed on the MTJs 62, 72, a cap layer 68 disposed on sidewalls of the MTJs 62, 72 and top electrodes 78, a connecting structure 100 disposed on each of the top electrodes 78, a metal interconnection 102 disposed on the logic region 16, and an IMD layer 80 surrounding the cap layer 68 and the metal interconnection 102.

In this embodiment, each of the connecting structure 100 preferably includes a hard mask 92 disposed on the top electrode 78, a barrier layer 96 disposed on the hard mask 92, and a metal layer 98 disposed on the barrier layer 96, in which the width of the top electrode 78 is preferably less than the width of the connecting structure 100, the bottom surface of the connecting structure 100 contacts the top electrode 78, cap layer 68, and IMD layer 80 directly, and the hard mask 92 and top electrode 78 could be made of same or different materials. Specifically, the hard mask 92 and the top electrode 78 are preferably made of metal nitrides including but not limited to for example TiN, the barrier layer 96 could include titanium (Ti), titanium nitride (TiN), tantalum (Ta), tantalum nitride (TaN), or combination thereof and the metal layer 98 could include tungsten (W), copper (Cu), aluminum (Al), titanium aluminide (TiAl), cobalt tungsten phosphide (CoWP), or combination thereof.

In contrast to the tri-layer structure of the connecting structure 100 on the MTJ region 14, the metal interconnection 102 on the logic region 16 only includes a barrier layer 96 and a metal layer 98. Since the connecting structures 100 and the metal interconnection 102 are fabricated from the same process, the barrier layer 96 and metal layer 98 in the metal interconnection 102 are preferably the same as the barrier layer 96 and metal layer 98 in the connecting structure 100. Moreover, the metal interconnection 102 further includes a via conductor 118 and a trench conductor 120, in which the bottom surface of the trench conductor 120 is lower than the bottom surface of the connecting structure 100 and the bottom of the metal interconnection 32 on the MTJ region 14 is even with the bottom of the via conductor 118.

Figure 10:
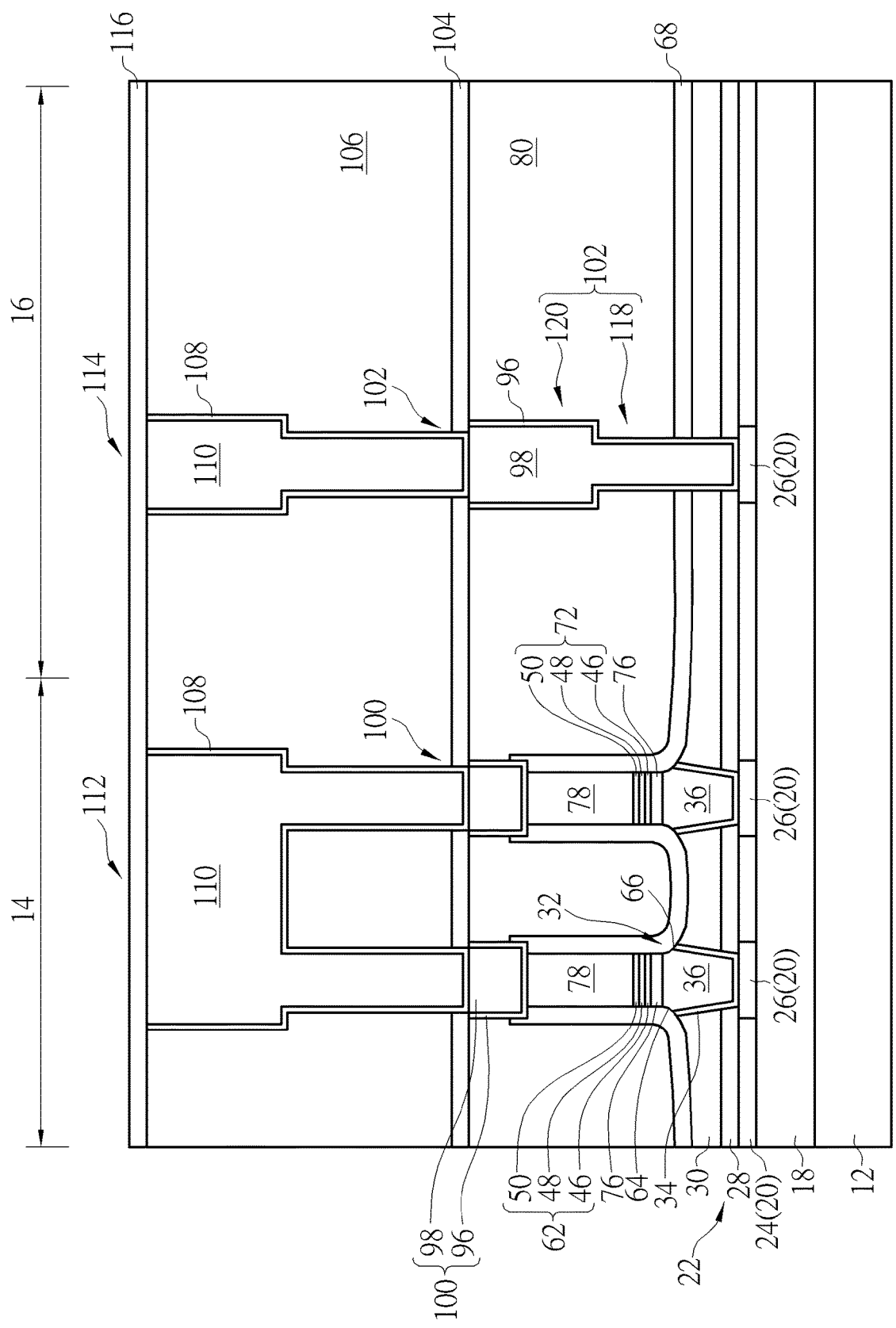
FIG. 10 illustrates a structural view of a semiconductor device according to an embodiment of the present invention.

Referring to FIG. 10, FIG. 10 illustrates a structural view of a semiconductor device according to an embodiment of the present invention. As shown in FIG. 10, the semiconductor device preferably includes metal interconnections 32 disposed on the MTJ region 14, an IMD layer 30 surrounding the metal interconnections 32, MTJs 62, 72 disposed on the metal interconnections 32, top electrodes 78 disposed on the MTJs 62, 72, a cap layer 68 disposed on sidewalls of the MTJs 62, 72 and top electrodes 78, a connecting structure 100 disposed on each of the top electrodes 78, a metal interconnection 102 disposed on the logic region 16, and an IMD layer 80 surrounding the cap layer 68 and the metal interconnection 102.

In contrast to the connecting structure 100 including hard mask 92, barrier layer 96, and metal layer 98 in the aforementioned embodiment, the connecting structure 100 in this embodiment only includes a barrier layer 96 and a metal layer 98 and without any hard mask disposed between the barrier layer 96 and the top electrode 78. Preferably, the width of the top electrode 78 is less than the width of the connecting structure 100, the bottom of the connecting structure 100 directly contacts the top electrode 78 and cap layer 68 and could choose to directly contact or not contacting the IMD layer 80, the bottom surface of the trench conductor 120 in the metal interconnection 102 on the logic region 16 is lower than the bottom surface of the connecting structure 100, and the bottom of the metal interconnection 32 on the MTJ region 14 is even with the bottom of the via conductor 118. Similar to the aforementioned embodiment, the barrier layer 96 could include titanium (Ti), titanium nitride (TiN), tantalum (Ta), tantalum nitride (TaN), or combination thereof and the metal layer 98 could include tungsten (W), copper (Cu), aluminum (Al), titanium aluminide (TiAl), cobalt tungsten phosphide (CoWP), or combination thereof.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
   a substrate comprising a magnetic tunneling junction (MTJ) region and a logic region;
   a MTJ on the MTJ region;
   a top electrode on the MTJ;
   a connecting structure on the top electrode; and
   a first metal interconnection on the logic region, wherein the first metal interconnection comprises:

a via conductor on the substrate; and a trench conductor, wherein a bottom surface of the trench conductor is lower than a bottom surface of the connecting structure and a width of the via conductor is less than a width of the trench conductor.

2. The semiconductor device of claim 1, further comprising:

an inter-metal dielectric (IMD) layer on the substrate; and a second metal interconnection in the IMD layer, wherein the MTJ is on the second metal interconnection.

3. The semiconductor device of claim 2, wherein bottom surfaces of the second metal interconnection and the via conductor of the first metal interconnection are coplanar.

4. The semiconductor device of claim 1, wherein top surfaces of the trench conductor and the connecting structure are coplanar.

5. The semiconductor device of claim 1, wherein the connecting structure and the first metal interconnection comprise a same material.

6. The semiconductor device of claim 1, wherein a width of the top electrode is less than a width of the connecting structure.

7. A semiconductor device, comprising:

a substrate comprising a magnetic tunneling junction (MTJ) region and a logic region;

a MTJ on the MTJ region;

a top electrode on the MTJ; and a connecting structure on the top electrode, wherein the connecting structure comprises:

a hard mask on the top electrode;

a barrier layer on the hard mask; and a metal layer on the barrier layer, wherein top surfaces of the hard mask and the metal layer are coplanar.

8. The semiconductor device of claim 7, further comprising:

a first metal interconnection on the logic region, wherein the first metal interconnection comprises:

a via conductor on the substrate; and a trench conductor, wherein a bottom surface of the trench conductor is lower than a bottom surface of the connecting structure.

9. The semiconductor device of claim 8, wherein top surfaces of the trench conductor and the connecting structure are coplanar.

10. The semiconductor device of claim 7, further comprising:

an inter-metal dielectric (IMD) layer on the substrate; and a second metal interconnection in the IMD layer, wherein the MTJ is on the second metal interconnection.

11. The semiconductor device of claim 10, wherein bottom surfaces of the second metal interconnection and the via conductor of the first metal interconnection are coplanar.

12. The semiconductor device of claim 7, wherein a width of the top electrode is less than a width of the connecting structure.

13. The semiconductor device of claim 7, wherein the hard mask and the top electrode comprise a same material.

* * * * *